May 30, 1967

G. CSANKY 3,322,972

HIGH CURRENT NEGATIVE RESISTANCE TRANSISTOR CIRCUITS UTILIZING AVALANCHE DIODES

Filed Oct. 8, 1964

INVENTOR.
GEZA CSANKY

BY Mueller & Aichele

Attys.

United States Patent Office 3,322,972
Patented May 30, 1967

3,322,972
HIGH CURRENT NEGATIVE RESISTANCE TRANSISTOR CIRCUITS UTILIZING AVALANCHE DIODES

Geza Csanky, Mesa, Ariz., assignor to Motorola, Inc., Franklin Park, Ill., a corporation of Illinois
Filed Oct. 8, 1964, Ser. No. 402,469
9 Claims. (Cl. 307—88.5)

ABSTRACT OF THE DISCLOSURE

A negative resistance circuit including a first transistor serially connected to a load between input terminals to which a variable input voltage is applied. A second transistor is connected between the input terminals and the first transistor for controlling the conductivity of the first transistor, and a resistor and an avalanche diode are serially connected across the input terminals and to the second transistor for controlling the conductivity of the second transistor in accordance with voltage variations at the input terminals, thereby controlling the conductivity of the first transistor so that decreasing current flows through the load for an increasing voltage applied to the input terminals.

This invention relates to electronic current regulators, and particularly to semiconductor circuits exhibiting negative resistance characteristics.

In many present day electrical systems requiring high operating currents it is desirable that current adjustment take place such that the current is diminished when the supply voltage increases. Circuits exhibiting negative resistance characteristics, that is, circuits providing an inverse voltage-current relationship, are inherently suitable to provide current adjustment for such applications.

An example of a system requiring current adjustment in the described manner is an automotive electrical system, wherein constant current to the field winding of an alternator or generator is desired when the machine is charging the battery, and grossly diminished current is desired when the voltage has exceeded some critical value. The device which achieves this is commonly known as the "voltage regulator" of the automotive electrical system. Negative resistance circuits used for this and other applications should have a high current handling capacity, and should be simple in construction and reliable in operation. Such circuits should also provide a negative resistance characteristic that can be readily varied to meet the needs of a particular application, and preferably should be current regulating prior to voltage levels at which the negative resistance action takes place.

Accordingly, it is an object of the present invention to provide an improved negative resistance circuit with high current handling capacities.

Another object of the invention is to provide a simple, reliable circuit exhibiting a variable negative resistance characteristic.

Still another object is to provide a circuit exhibiting a current-regulating characteristic at voltages below the range where negative resistance occurs.

A further object of the invention is to provide a negative resistance circuit having high current capacities, and which may be conveniently adopted for use in a number of circuit configurations requiring two, three or more terminals.

The negative resistance circuit of the present invention comprises a voltage comparing arrangement including voltage breakdown means combined with an amplifying transistor to control the current of a regulating transistor connected in series with a load through which current is to be controlled. The circuit tends to be current-regulating until the applied voltage rises to a predetermined level, as established by the voltage breakdown means of the voltage comparing arrangement, when a change in the biasing of the amplifying transistor takes place such that its current gain decreases for an increased applied voltage. This decreasing current gain results in a corresponding change in the bias current controlling the regulating transistor, such that decreasing current is supplied to the load with an increasing applied voltage. Thus the circuit provides a negative resistance characteristic when the applied voltage exceeds a predetermined level and until the current of the amplifying transistor decreases to the approximate value of its leakage current.

Circuit details and an understanding of the operation of various embodiments of the invention are best understood from the following description when taken in conjunction with the accompanying drawings, in which.

Figure 1:
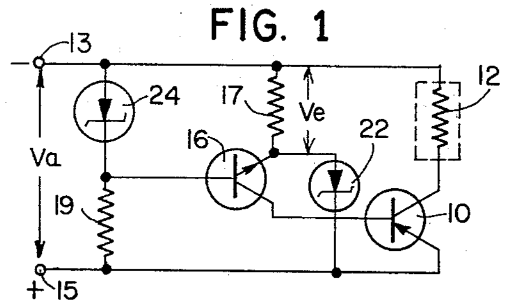
FIG. 1 is a schematic diagram of one embodiment of the invention.

Referring now to FIG. 1, transistor 10, which may be considered an output transistor, is connected in series with load 12 between input voltage terminals 13 and 15. To this end, one side of load 12 is connected to the collector electrode of transistor 10 and the other side of load 12 is returned to voltage terminal 13. The emitter electrode of transistor 10 is returned to voltage terminal 15. For the PNP transistor shown, a positive voltage is applied to terminal 15 and a negative voltage to terminal 13. Either terminal may be connected to ground reference potential, depending on the requirements of the system utilizing the negative resistance characteristics exhibited by the circuit. Preferably, transistor 10 is a germanium power transistor having high current handling capacities, for example, 1 ampere or greater.

Emitter-base bias current for transistor 10 is obtained by connecting its base electrode to the collector electrode of current amplifying transistor 16. Transistor 16 may, for example, be a small-signal silicon NPN transistor. The emitter electrode of transistor 16 is returned to terminal 13 by resistor 17 and its base electrode returned to terminal 15 by resistor 19. To complete the circuit, avalanche diode 22 is connected between the emitter electrode of transistor 16 and terminal 15, and avalanche diode 24 is connected between the base electrode of transistor 16 and terminal 13. Avalanche diodes 22 and 24 are poled to breakdown when the voltage applied between terminals 13 and 15 exceeds a predetermined level. Thus resistor 17 and avalanche diode 22, and avalanche diode 24 and resistor 19, provide voltage dividers for applying emitter-base bias to transistor 16.

It can be seen that the above described circuit is simple in construction, requiring a minimum number of circuit elements. To understood the manner in which it produces negative resistance characteristics, reference should be made to the curves illustrated in FIG. 2. When voltage $V_a$ (FIG. 1) applied between terminals 13 and 15 is less than the breakdown voltage of either of avalanche diodes 22 and 24, both avalanche diodes present a high impedance and may be considered absent from the circuit. Under these conditions, a shunt current path is provided through resistor 17, the emitter-base junction of transistor 16, and resistor 19. With an increasing input voltage $V_a$, the collector current of transistor 16 is supplied to the base electrode of transistor 10, resulting in a corresponding increase in collector current for transistor 10. This is illustrated by the initial portion 32 of the V–I curve 30 illustrated in FIG. 2. Since only the base current of transistor 16 is supplied through resistor 19, a substantial portion of the input voltage $V_a$ is developed across avalanche diode 24. The emitter-base voltage drop of transistor 16 may be considered negligible so that only a small fraction of input voltage $V_a$, determined primarily by the voltage drop across resistor 19, appears across avalanche diode 22.

From the foregoing it can be seen that as the input voltage $V_a$ increases avalanche diode 24 will breakdown before avalanche diode 22. Accordingly, a further increase in input voltage $V_a$ causes breakdown of avalanche diode 24, clamping or stabilizing the base electrode of transistor 16 with respect to the voltage at terminal 13. At this point the circuit may be considered a conventional current regulating circuit and any increase in current through transistor 10 is due to the current gain of transistor 16. As a result substantially constant current is provided to load 12 by transistor 10, as illustrated by portion 34 of the V–I curve 30 of FIG. 2.

A further increase in input voltage $V_a$ appears primarily across avalanche diode 22, subsequently causing it to break down. This is turn clamps or stabilizes the emitter electrode of transistor 16 with respect to the voltage at terminal 15. The point of breakdown of avalanche diode 22 is shown at 35 on the V–I curve 30 of FIG. 2. Prior to breakdown of avalanche diode 22 the emitter voltage of transistor 16 is determined primarily by avalanche diode 24, and is substantially constant. However, subsequent to breakdown of avalanche diode 22 variations in input voltage $V_a$ can no longer appear across avalanche diode 22, and hence must produce corresponding variations in voltage drop $V_e$ across resistor 17. The net result is to cause a change in the biasing of transistor 16 when input voltage $V_a$ rises to a level to cause breakdown of both avalanche diodes 22 and 24.

Accordingly, an increase input voltage $V_a$ results in an increasing voltage drop $V_e$ across resistor 17. This reduces the net emitter-base biasing transistor 16, and the base current supplied to transistor 10 will be reduced a corresponding amount. Stated another way, avalanche diodes 22 and 24 function as a voltage comparing arrangement by acting against one another to decrease the emitter-base bias for transistor 16 for an increasing input voltage $V_a$. This action continues until the emitter-base bias for transistor 16 is reduced to zero, at which time only leakage current flows in transistor 16. This point is illustrated by reference numeral 37 on the V–I curve 30 of FIG. 2. Thus it can be seen from FIG. 2 that negative resistance range 36 is provided between points 35 and 37 on the V–I curve 30. Since the total emitter-base voltage drop of transistor 16 is relatively small (typically .05–1.0 volt) a very sharp negative resistance characteristic is provided. This voltage drop is approximately equal to $V_n$ in FIG. 2, and illustrates a large current decrease for a small voltage increase, or a value of negative resistance of very small magnitude.

The value of the negative resistance provided by the foregoing circuit may be approximated by:

$$R_n \cong -\frac{kT}{(B_1+1)\alpha_2 q I_e} \tag{1}$$

where $k$=Boltzmann's constant
$T$=Absolute temperature
$B_1$=current gain (common emitter) of transistor 10
$\alpha_2$=current gain (common base) of transistor 16
$q$=electronic charge
$I_e$=the emitter current of transistor 10

Figure 2:
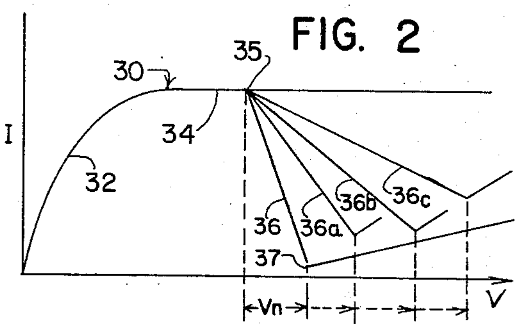
FIG. 2 is a plot of V–I curves for the circuits of the invention, illustrating the negative resistance characteristics thereby provided.
Figure 3:
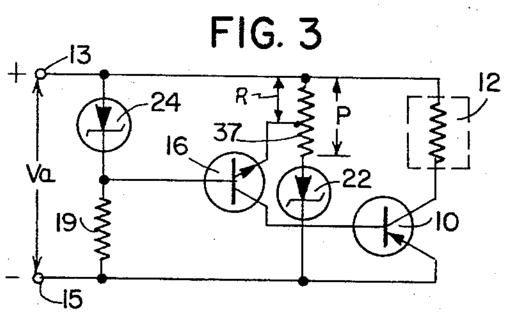
FIG. 3 is a schematic diagram illustrating the manner in which the negative resistance provided by the circuits of the invention may be varied.

As previously mentioned, in many applications it is desirable to vary the value of the negative resistance attained by the foregoing circuit. A modification of the circuit of the invention, whereby a variable negative resistance attained by the foregoing circuit. A modification of the circuit of the invention, whereby a variable negative resistance characteristic is achieved, is illustrated in FIG. 3, wherein like reference numerals refer to like circuit elements as in FIG. 1. As shown in FIG. 3, resistor 17 is replaced by potentiometer 37. One end of potentiometer 37 is returned to terminal 13 and the other end of potentiometer 37 is connected to avalanche diode 22. The emitter electrode of transistor 16 is connected to the variable tap point of potentiometer 37. By this arrangement the variation in voltage $V_e$ applied to the emitter electrode of transistor 16 subsequent to the breakdown of avalanche diode 22 is only a fraction of the total voltage variation appearing between terminals 13 and 15. This fraction, in turn, is determined by the setting of the tap point of potentiometer 37. As a result the negative resistance range $V_n$ (FIG. 2) and the value of negative resistance $R_n$ provided by Equation 1 is directly proportional to the ratio of the total resistance (P) of potentiometer 37 and the portion (R) tapped off between terminal 13 and the emitter electrode of transistor 16. The resulting increase in negative resistance is shown by negative resistance portions 36*a*, 36*b* and 36*c* of the V–I curve 30 (FIG. 2), and may be expressed by the following:

$$R_n \cong -\frac{kT}{(B_1+1)\alpha_2 q I_e}\left(\frac{P}{R}\right) \tag{2}$$

This provides a convenient arrangement for varying the value of negative resistance ($R_n$) from a low value (a few milliohms) to infinity.

Although illustrated as a two-terminal network the above-described circuit is not necessarily so limited. For example, either or both of avalanche diodes 22 and 24 may be returned to a reference voltage other than terminals 13 and 15. This provides a convenient method of establishing the voltage at which the avalanche diodes break down, independently of the voltage supplying current to load 12. In addition, load 12 may have one end thereof connected to either the collector or emitter electrode of transistor 10, with the other end thereof returned to a reference potential. Such a reference potential may be common to either of terminals 13 or 15. This latter arrangement is useful, for example, in incorporating the circuit of the invention with an alternator of an automotive electrical system.

Figure 4:
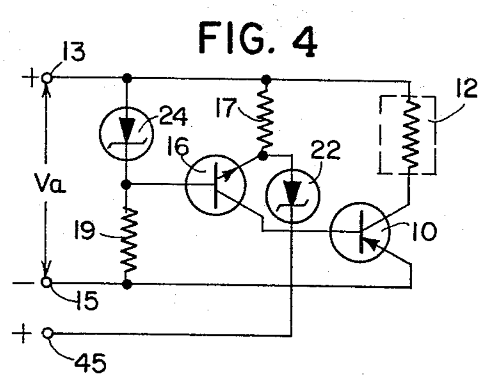
FIG. 4 is a schematic diagram illustrating a three terminal embodiment of the invention.

A three-terminal modification of the foregoing circuit is illustrated in FIG. 4, wherein like reference numerals refer to like circuit elements as in FIGS. 1 and 3. One end of avalanche diode 22 is returned to an additional terminal 45 rather than to terminal 15. This allows a reference voltage independent of the voltage applied to terminals 13 and 15 to be utilized to determine the point at which avalanche diode 22 breaks down, and hence allows control of the point 35 at which the negative resistance characteristics start on the V–I curve 30 of FIG. 2.

Figure 5:
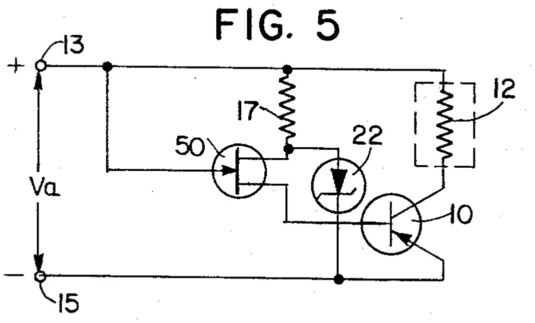
FIG. 5 is a schematic diagram of an embodiment of the invention utilizing a field-effect transistor.

A further modification of the circuit of the invention, wherein transistor 16, resistor 19 and avalanche diode 24 are replaced by a field-effect transistor, is illustrated in FIG. 5. This substitution is possible in that a field-effect transistor is inherently current limiting when biased beyond pinchoff. When connected as shown in FIG. 5, a field-effect transistor therefore provides the characteristic illustrated by portions 32 and 34 of V–I curve 30 of FIG. 2, with portion 34 occurring when voltage $V_a$ exceeds a level to cause pinch-off. Thus, as shown, the source electrode of field-effect transistor 50 is connected to one end of resistor 17 and its drain electrode returned to the base electrode of transistor 10. The gate electrode of field-effect transistor 50 is returned directly to terminal 13. Avalanche diode 22 is connected between the source electrode of field-effect transistor 50 and terminal 15, in a manner analogous to the previous embodiments. When input voltage $V_a$ rises to a value sufficient to cause avalanche diode 22 to breakdown, negative resistance characteristics as illustrated by curve portions 35–36*c* of the V–I curve 30 of FIG. 2 are obtainable. Resistor 17 may conveniently be replaced by potentiometer 37 in the manner of FIG. 3. Various other modifications mentioned are also possible with the circuit of FIG. 5.

Because of the simplicity of the above described circuit embodiments, utilizing only semiconductor devices and resistance components, entire negative resistance circuits of the described types may be fabricated by monolithic and other integrated circuit techniques, and provided in housings no larger than those required for conventional power transistors. The circuits of the invention provide extremely high current handling capabilities (in excess of 1 ampere), and also may be supplied with simple means for adjusting the negative resistance value obtained, varying from a few milliohms to infinity.

While certain preferred embodiments of the invention have been described, other modifications thereof will become apparent to those skilled in the art and the above description and accompanying drawings shall be interpreted as illustrative and not limiting.

I claim:

1. A negative resistance circuit including in combination, a first transistor having input, output and control electrodes, input terminal means, means for connecting the input and output electrodes of said first transistor in series between a load and said input terminal means, a second transistor having input, output and control electrodes, means connecting the output electrode of said second transistor to the control electrode of said first transistor, a first avalanche diode and a first resistance means connected in series between said input terminal means and a reference point, with the junction of said first avalanche diode and said first resistance means connected to the control electrode of said second transistor, second resistance means and a second avalanche diode connected in series between said input terminal means and a reference point, and means connecting the junction of said second resistance means and said second avalanche diode means to the input electrode of said second transistor, with a voltage applied to said input terminal means exceeding the breakdown voltage of said first and second avalanche diodes changing the biasing of said second transistor, thereby to control said first transistor so that decreasing current flows through said load for an increasing voltage applied to said input terminal means.

2. A negative resistance circuit including in combination, a first transistor having input, output and control electrodes, input terminal means, means for connecting the input and output electrodes of said first transistor in series between a load and said input terminal means, a second transistor having input, output and control electrodes, means connecting the output electrode of said second transistor to the control electrode of said first transistor, a first avalanche diode and a first resistor means connected between said input terminal means and a reference point, with the junction of said first avalanche diode and said first resistor means connected to the control electrode of said second transistor, a variable resistor and a second avalanche diode connected in series between said input terminal means and a reference point, and means connecting the tap point of said variable resistor to the input electrode of said second transistor, with a voltage applied to said input terminal means exceeding the breakdown voltage of said first and second avalanche diodes changing the biasing of said second transistor, thereby to control said first transistor so that decreasing current flows through said load for an increasing voltage applied to said input terminal means.

3. A negative resistance circuit including in combination, a first transistor having input, output and control electrodes, input terminal means including first and second terminals, means for connecting the input and output electrodes of said first transistor in series between a load and said input terminal means, a second transistor having input, output and control electrodes, means connecting the output electrode of said second transistor to the control electrode of said first transistor, a first avalanche diode and first resistor means connected in series between said input terminal means and a reference point, with the junction of said first avalanche diode and said first resistor means connected to the control electrode of said second transistor, second resistor means and a second avalanche diode connected in series between said input terminal means and a reference point, and means connecting the junction of said second avalanche diode and said variable resistor to the input electrode of said second transistor, with a voltage exceeding the breakdown voltage of said first and second avalanche diodes changing the biasing of said second transistor, thereby to control said first transistor so that decreasing current flows through said load for an increasing voltage applied between said first and second terminals.

4. A negative resistance circuit including in combination, a first transistor having input, output and control electrodes, input terminal means, means for connecting the input and output electrodes of said first transistor in series between a load and said input terminal means, a field-effect transistor having input, output and control electrodes, means connecting the output electrode of said field-effect transistor to the control electrode of said first transistor, means connecting the control electrode of said field-effect transistor to said input terminal means, an avalanche diode and a resistor series connected between said input terminal means and a reference point, and means connecting the junction between said avalanche diode and said resistor to the input electrode of said field-effect transistor, thereby to control said first transistor so that decreasing current flows through said load for an increasing voltage applied to said input voltage terminals.

5. An electrical circuit including in combination, a first transistor having emitter, collector and base electrodes, input terminal means, means for connecting the emitter and collector electrodes of said first transistor in series between a load and said input terminal means, a second transistor having emitter, collector and base electrodes, means connecting the collector electrode of said second transistor to the base electrode of said first transistor, a first avalanche diode and a first resistor series connected between said input terminal means and a reference point, with the junction between said first avalanche diode and said first resistor connected to the base electrode of said second transistor, a second resistor and a second avalanche diode series connected between said input terminal means and a reference point, with the junction between said second resistor and said second avalanche diode connected to the emitter electrode of said second transistor, said circuit exhibiting constant current characteristics for a voltage applied to said input terminal means exceeding the breakdown level of said first avalanche diode, and said circuit exhibiting negative resistance characteristics for a voltage applied to said input terminal means exceeding the breakdown level of both said avalanche diodes.

6. An electrical circuit including in combination, a first transistor having emitter, collector and base electrodes, input terminal means, means for connecting the emitter and collector electrodes of said first transistor in series between a load and said input terminal means, a second transistor having emitter, collector, and base electrodes, means connecting the collector electrode of said second transistor to the base electrode of said first transistor, a first avalanche diode and a resistor series connected between said input terminal means and a reference point, with the junction between said first avalanche diode and said resistor connected to the base electrode of said second transistor, a variable resistor and a second avalanche diode series connected between said input terminal means and a reference point, with the juncture between said variable resistor and said second avalanche diode connected to the emitter electrode of said second transistor, said circuit exhibiting constant current characteristics for a voltage applied to said input terminal means exceeding the breakdown level of said first avalanche diode, and said circuit exhibiting negative resistance characteristics for an input voltage supplied to said input terminal means exceeding the breakdown voltage of both said avalanche diodes.

7. An electrical circuit including in combination, a first transistor having emitter, collector and base electrodes, input terminal means having first and second terminals, means for connecting the emitter and collector electrodes of said first transistor in series between a load and said first and second terminals, a second transistor having emitter, collector and base electrodes, means connecting the collector electrode of said second transistor to the base electrode of said first transistor, a first avalanche diode and a first resistor series connected between said first and second terminals, with the junction between said first avalanche diode and said first resistor connected to the base electrode of said second transistor, a second resistor and a second avalanche diode series connected between one of said terminals and a reference potential, with the junction between said second resistor and said second avalanche diode connected to the emitter electrode of said second transistor, said circuit exhibiting constant current characteristics for a voltage applied between said first and second terminals exceeding the breakdown voltage level of said first avalanche diode, and said circuit exhibiting negative resistance characteristics for a voltage applied between said first and second terminals exceeding the breakdown voltage level of both said avalanche diodes.

8. An electrical circuit including in combination, a first transistor having emitter, collector and base electrodes, input terminal means having first and second terminals, means for connecting the emitter and collector electrodes of said first transistor in series between a load and said first and second terminals, a field-effect transistor having source, drain and gate electrodes, means connecting the drain electrode of said field-effect transistor to the base electrode of said first transistor, means connecting the gate electrode of said field-effect transistor to one of said terminals, a resistor and an avalanche diode series connected between said terminals, and means connecting the junction between said resistor and said avalanche diode to the source electrode of said field-effect transistor, said circuit exhibiting constant current characteristics for an input voltage level applied between said terminals causing pinchoff bias for said field-effect transistor, and said circuit exhibiting negative resistance characteristics for an input voltage level applied between said terminals exceeding the breakdown voltage of said avalanche diode.

9. A negative resistance circuit including in combination, a first transistor having input, output and control electrodes, first and second input terminals, means connecting the input and output electrodes of said first transistor in series with a load resistor between said first and second input terminals, a second transistor having input, output and control electrodes, means connecting the output electrode of said second transistor to the control electrode of said first transistor, an avalanche diode and a resistor connected in series between said first and second input terminals, with the junction of said avalanche diode and said resistor connected to one of said control and input electrodes of said second transistor, said avalanche diode clamping said one of said control and input electrodes of said second transistor when the input voltage applied to said first and second input terminals reaches a predetermined value.

References Cited

UNITED STATES PATENTS

| | | | |
|---|---|---|---|
| 3,047,667 | 7/1962 | Hussey | 307—88.5 X |
| 3,223,849 | 12/1965 | Todd | 307—88.5 |

ARTHUR GAUSS, *Primary Examiner.*

D. D. FORRER, *Assistant Examiner.*